(12) United States Patent
Kuramoto et al.

(10) Patent No.: US 6,919,634 B2
(45) Date of Patent: Jul. 19, 2005

(54) SOLDER BALL ASSEMBLY, A METHOD FOR ITS MANUFACTURE, AND A METHOD OF FORMING SOLDER BUMPS

(75) Inventors: Takeo Kuramoto, Atsugi (JP); Kaichi Tsuruta, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 10/632,106

(22) Filed: Aug. 1, 2003

(65) Prior Publication Data

US 2004/0070084 A1 Apr. 15, 2004

(30) Foreign Application Priority Data

Aug. 2, 2002 (JP) ........................................ 2002-226340

(51) Int. Cl.[7] .......................... H01L 23/48; H01L 23/52; H01L 29/40
(52) U.S. Cl. ........................................ 257/738; 257/780
(58) Field of Search .............................. 257/737, 738, 257/779, 780, 781; 438/108, 612, 613, 666

(56) References Cited

U.S. PATENT DOCUMENTS

| 6,084,781 | A | * | 7/2000 | Klein | 361/771 |
| 6,087,597 | A | * | 7/2000 | Shimada et al. | 174/263 |
| 6,201,707 | B1 | * | 3/2001 | Sota | 361/761 |
| 6,460,755 | B1 | * | 10/2002 | Inoue et al. | 228/246 |
| 6,596,620 | B2 | * | 7/2003 | Cheng et al. | 438/613 |

FOREIGN PATENT DOCUMENTS

| JP | 08115916 | 5/1996 |
| JP | 08309523 | 11/1996 |
| JP | 10275974 | 10/1998 |
| JP | 2001-196730 | 7/2001 |

* cited by examiner

*Primary Examiner*—Hoai Pham
(74) *Attorney, Agent, or Firm*—Michael Tobias (57) ABSTRACT

A solder ball assembly includes a mask having first and second sides and a plurality of holes formed therein. Each hole has a first end opening onto the first side of the mask and a second end. A plurality of solder balls are disposed in the holes, and a fixing agent secures the solder balls in the holes. A protective sheet may be attached to one or both sides of the mask to cover the ends of the holes.

19 Claims, 4 Drawing Sheets

SOLDER BALL ASSEMBLY, A METHOD FOR ITS MANUFACTURE, AND A METHOD OF FORMING SOLDER BUMPS

BACKGROUND OF THE INVENTION

1. Field of the Invention

This invention relates to a ball assembly for use in arranging solder balls or other types of balls in a prescribed pattern in preparation for forming the balls into solder bumps. It also relates to a method for manufacturing a ball assembly, and to a method of forming solder bumps using the ball assembly.

2. Description of the Related Art

One method of soldering an electronic part to a substrate employs solder bumps, which are previously formed on the electrodes of the electronic part and/or the electrodes of the substrate.

Various methods have been proposed in the past for forming solder bumps, such as the solder paste method, the solder ball method, and the plating method. Each of these methods has its advantages and disadvantages. The solder ball method is advantageous in that the amount of solder which is applied to an electrode can be accurately controlled, and it is relatively economical. In carrying out the solder ball method, it is important to accurately position the solder balls on prescribed electrodes.

There have been various proposals for methods of arranging solder balls on electrodes. For example, Japanese Published Unexamined Patent Application Hei 08-115916 and Japanese Published Unexamined Patent Application Hei 10-275974 disclose methods in which solder balls are held in a prescribed pattern by a suction jig, and the solder balls are then transferred by the jig to atop electrodes on a substrate. However, the equipment required for these methods is complicated in structure, and each time the pattern of the electrodes on which the solder balls are to be mounted is modified, it is necessary to remanufacture the jig, which requires the expenditure of considerable amounts of money and time. Furthermore, there is a limit to the electrode pitch which can be achieved by such methods, so they are inappropriate for forming solder bumps on an electrode pattern with an extremely fine pitch.

SUMMARY OF THE INVENTION

The present invention provides a solder ball assembly which enables solder balls to be efficiently formed on an electrode pattern on a substrate, and even one having an extremely fine pitch of 200 $\mu$m or less. The present invention also provides a method of manufacturing the solder ball assembly and a method of forming solder bumps using the solder ball assembly.

The present inventors founds that solder balls can be easily arranged in a desired pattern corresponding to a pattern of electrodes on which solder bumps are to be formed by inserting the solder balls into holes formed in a mask and then fixing the solder balls in the holes with a fixing agent. The fixing agent enables the mask to be handled without the solder balls falling out of the holes. The mask can be placed atop a substrate with each of the holes in the mask (and with each of the solder balls which are disposed in the holes) aligned with a corresponding electrode on the substrate. If the mask is heated in this state, the heating causes the fixing agent to flow and release the solder balls from the mask. Heating also causes the solder balls to reflow and form solder bumps atop the electrodes. After the solder bumps have solidified atop the electrodes, the mask can be removed from the substrate.

The mask can be formed very easily and inexpensively, so changes in the pattern of electrodes on a substrate can be readily accommodated by forming a new mask having a pattern of holes corresponding to the new electrode pattern.

According to one aspect of the present invention, a solder ball assembly includes a mask having first and second sides and a plurality of holes formed therein, each hole having a first end opening onto the first side of the mask and a second end, a plurality of solder balls disposed in the holes, and a fixing agent securing the solder balls in the holes.

The solder ball assembly may further include a protective sheet attached to the first side of the mask and covering the first end of each of the holes. When the second ends of the holes extend to the second side of the mask, the assembly may also include a protective sheet attached to the second side of the mask and covering the second end of each of the holes.

According to another form of the present invention, a method of manufacturing a solder ball assembly includes inserting a plurality of solder balls into holes formed in a mask, each hole having a first end opening onto a first side of the mask and a second end, each solder ball being inserted through the first end of a corresponding one of the holes, and fixing the solder balls in the holes with a fixing agent.

Inserting the solder balls into the holes in the mask may be facilitated by applying suction to the second end of each hole while inserting the solder balls into the holes.

When a protective sheet is attached to the first side of the mask to cover the first end of each of the holes, the protective sheet may be attached after fixing the solder balls in the holes. Alternatively, the protective sheet may be coated with the fixing agent prior to being applied to the first side of the mask, and the protective sheet may be heated to make the fixing agent flow into the holes to fix the solder balls in the holes.

According to still another form of the present invention, a method of forming solder bumps includes placing a solder ball assembly according to the present invention on a substrate with each of the solder balls of the assembly aligned with a corresponding electrode of the substrate, then heating the solder ball assembly to cause the fixing agent to release the solder balls, reflowing the solder balls to form the solder balls into solder bumps atop the electrodes, and then removing the mask from the substrate.

Depending upon the material of which the mask of a solder ball assembly according to the present invention is made, the mask may be capable of being used a plurality of times.

DESCRIPTION OF PREFERRED EMBODIMENTS

Figure 1:
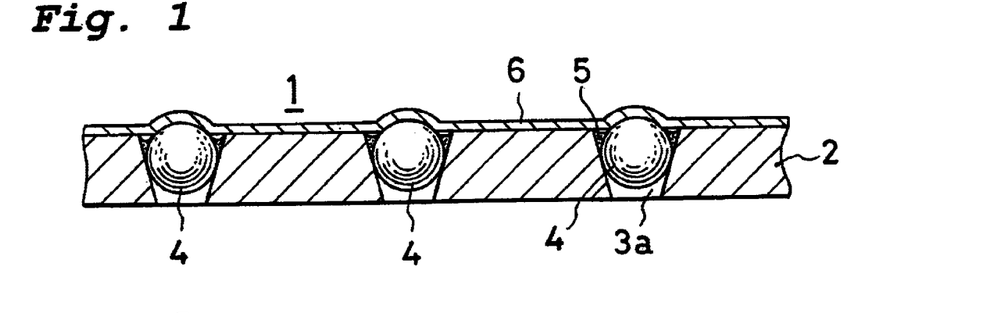
FIG. 1 is a vertical cross-sectional view of a portion of an embodiment of a solder ball assembly according to the present invention.

A number of preferred embodiments of a solder ball assembly according to the present invention will be described while referring to the accompanying drawings. FIG. 1 is a vertical cross-sectional view of a portion of a first embodiment of a solder ball assembly according to the present invention. As shown in this figure, a solder ball assembly 1 according to the present invention typically includes a mask 2 having a plurality of holes 3a formed therein. A prescribed number of solder balls 4 are disposed in each hole 3a, and each solder ball 4 is secured inside the corresponding hole 3a by a fixing agent 5. The solder ball assembly 1 may further include a protective sheet 6 disposed atop the mask 2 to protect the solder balls 4 against the environment (i.e., to protect the solder balls 4 against moisture, dust, exposure to air, etc.) before the solder balls 4 are mounted on a substrate to form solder bumps.

The mask 2 can be made from a wide variety of materials, including but not limited to resins, glass-epoxy composites, metals, ceramics, and paper. If it is desired for the mask 2 to remain in place on a substrate throughout the formation of solder bumps, the mask 2 is preferably made of a material which can withstand reflow temperatures.

As viewed in plan, the holes 3a are formed in the mask 2 in a pattern matching the pattern of the electrodes on a substrate on which solder bumps are to be formed. As a result, when the assembly 1 is placed atop the substrate, each of the holes 3a in the mask 2 (and each of the solder balls 4 in the holes 3a) is aligned with a corresponding one of the electrodes on the substrate.

The holes 3a may have a variety of shapes as viewed in vertical cross section. In the present embodiment, each of the holes 3a is tapered, with a diameter which decreases from the first end of the hole 3a (the upper end in FIG. 1) towards the second end (the lower end in FIG. 1). The first end of each hole 3a opens onto the first side of the mask 2 (the upper side in FIG. 1). In this embodiment, each hole 3a extends all the way through the mask 2 to the second side of the mask 2 (the lower side in FIG. 1), but as described below, it is also possible for the holes 3a to extend only partway through the thickness of the mask 2. The first end of each hole 3a is the end through which a solder ball 4 is inserted into the hole 3a.

The dimensions of the holes 3a are preferably selected so that only a prescribed number of solder balls 4 will fit into each hole 3a. Typically, the prescribed number will be a single solder ball 4, but it is also possible for there to be a plurality of solder balls 4 in each hole 3a. When a single solder ball 4 is intended to fit into each hole 3a, the depth of each hole 3a (the thickness of the mask 2 when the holes 3a extend all the way through the mask 2) is preferably less than 2 times and more preferably less than 1.5 times the diameter of the solder ball 4 disposed therein. The diameter of the first end of the hole 3a is at least the diameter of the solder ball 4 disposed therein, and preferably less than 2 times and more preferably less than 1.5 times the diameter of the solder ball 4. The diameter of the second end of the hole 3a is preferably smaller than the diameter of the solder ball 4 disposed therein to prevent the solder ball 4 from falling out the second end. The diameter of each solder ball 4 is preferably such that when the solder ball 4 is resting on the tapered inner surface of the corresponding hole 3a as shown in FIG. 1, the solder ball 4 extends out of the hole 3a and protrudes from the first side of the mask 2. When the solder balls 4 protrude from the first side of the mask 2, it can easily be determined whether a solder ball 4 is present in each hole 3a. In addition, precisely positioning the solder balls 4 on the electrodes of a substrate is facilitated.

The fixing agent 5 is provided on the interior of each hole 3a in contact with the solder ball 4 and the inner surface of the hole 3a in a sufficient amount to restrain the solder ball 4 against movement in the hole 3a and preferably so as to prevent the solder ball 4 from falling out of the hole 3a if the mask 2 is turned upside down.

Figure 2:
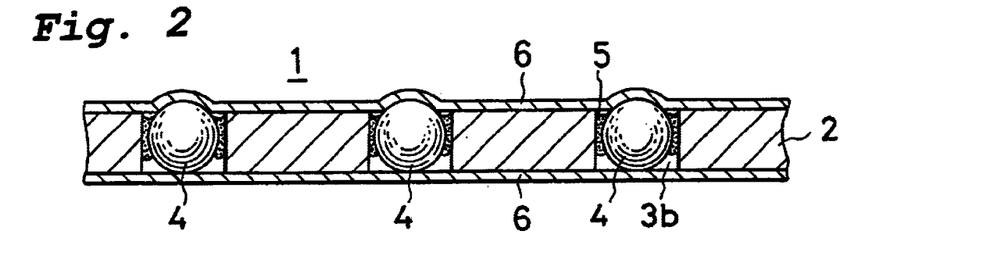
FIG. 2 is a vertical cross-sectional view of a portion of another embodiment of a solder ball assembly according to the present invention.

FIG. 2 is a vertical cross-sectional view of a portion of another embodiment of a solder ball assembly 1 according to the present invention. In this embodiment, a plurality of holes 3b formed in a mask 2 each has a cylindrical shape (i.e., a shape with a constant diameter over its height) instead of a tapered shape as in the embodiment of FIG. 1. The holes 3b are formed in a pattern matching the pattern of the electrodes on a substrate on which solder bumps are to be formed. A prescribed number of solder balls 4 (typically one solder ball 4) is retained inside each hole 3b by a suitable amount of a fixing agent 5 applied to the interior of the hole 3b and contacting the solder ball 4 and the inner surface of the hole 3b. The depth of each hole 3b (in this case, the thickness of the mask 2) is preferably less than 2 times and more preferably less than 1.5 times the diameter of the solder ball 4 housed therein. Still more preferably, the depth is less than the diameter of the solder ball 4 housed therein so that the solder ball 4 extends out of the hole 3b and protrudes from the first side of the mask 2. The diameter of each hole 3b is preferably at least the diameter of the solder ball 4 and preferably less than 2 times and more preferably less than 1.5 times the diameter of the solder ball housed therein. A protective sheet 6 may be attached to the first side of the mask 2 atop the holes 3b in the same manner as in FIG. 1. Another protective sheet 6 may also be attached to the second side of the mask 2 over the second ends of the holes 3b to provide further protection to the solder balls 4 against the environment and to help support the weight of the solder balls 4. A lower protective sheet 6 may also be provided in the embodiment of FIG. 1.

Figure 3:
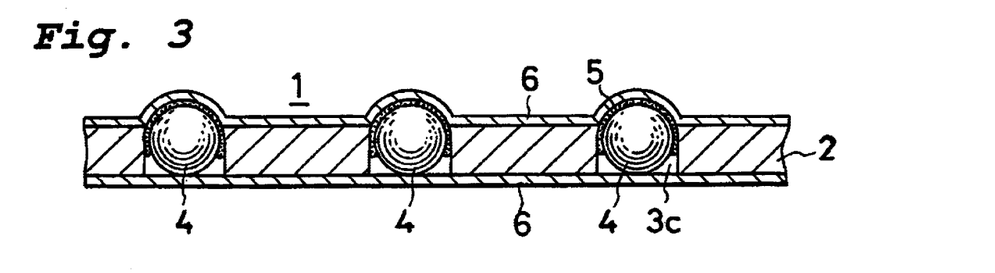
FIG. 3 is a vertical cross-sectional view of a portion of yet another embodiment of a solder ball assembly according to the present invention.

FIG. 3 is a vertical cross-sectional view of a portion of another embodiment of a solder ball assembly 1 according to the present invention. Like the embodiment of FIG. 2, this embodiment includes a mask 2 having a plurality of cylindrical holes 3c formed therein in a pattern matching the pattern of the electrodes on a substrate on which solder bumps are to be formed. This embodiment differs from the embodiment of FIG. 2 in that a fixing agent 5 applied to the interior of each hole 3c extends over the entire upper surface of the corresponding solder ball 4 in addition to being present between the solder ball 4 and the inner periphery of the hole 3c, whereas in the embodiment of FIG. 2, the fixing agent 5 extends only partway over the upper surface of each solder ball 4. The dimensions of the holes 3c may be the same as in the embodiment of FIG. 2. Having the fixing agent 5 extend over the entire upper surface of the balls 4 can be advantageous when the fixing agent 5 is capable of exerting a fluxing action during reflow of the solder balls 4, since it better enables the fixing agent 5 to contact and exert a fluxing action on the electrodes of a substrate on which solder bumps are to be formed. This embodiment is otherwise similar to the embodiment of FIG. 2. A fixing agent 5 may also be applied over the entire upper surface of the solder balls 4 in the embodiment of FIG. 1.

Figure 4:
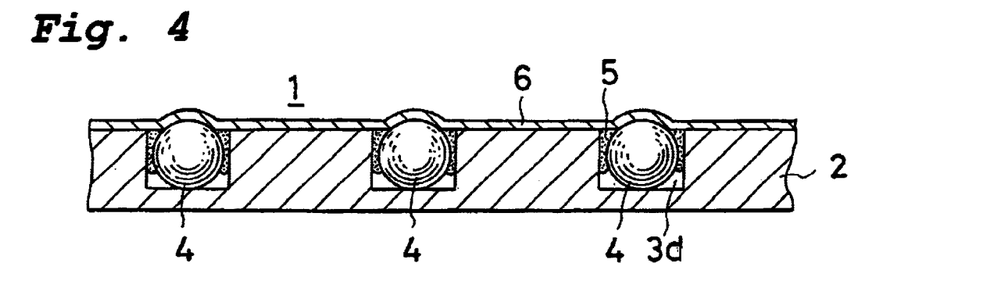
FIG. 4 is a vertical cross-sectional view of a portion of still another embodiment of a solder ball assembly according to the present invention.

The holes in a mask of a solder ball assembly according to the present invention need not extend through the entire thickness of the mask. FIG. 4 is a vertical cross-sectional view of a portion of another embodiment of a solder ball assembly 1 according to the present invention having a mask 2 with a plurality of holes 3d formed therein in a pattern matching the pattern of the electrodes on a substrate. Each of the holes 3d extends only partway through the thickness of the mask 2 and has a bottom surface at its second end. As in the embodiments of FIGS. 1 and 2, when a single solder ball 4 is intended to fit into each hole 3d, the depth of each hole 3d is preferably less than 2 times and more preferably less than 1.5 times the diameter of the solder ball 4 disposed therein. It is still more preferably less than the diameter of the solder ball 4 housed therein so that the solder ball 4 extends out of the hole 3d and protrudes from the first side of the mask 2. The diameter of each hole 3d is at least the diameter and preferably less than 2 times and more preferably less than 1.5 times the diameter of the solder ball 4 housed therein. As in the previous embodiments, each solder ball 4 is retained in the corresponding hole 3d by a fixing agent 5 applied to the interior of the hole 3d in contact with the inner surface of the hole 3d and the solder ball 4. The fixing agent 5 may extend over a portion or over the entire upper surface of the solder balls 4. A protective sheet 6 may be attached to the first side of the mask 2 atop the holes 3d.

The holes 3a–3d can be formed in a mask 2 of a solder ball assembly 1 according to the present invention by a wide variety of methods, such as laser beam machining, drilling, punching, or photoresist treatment. Laser beam machining is superior to drilling or punching from the standpoint of precision, but it is more restrictive than drilling or punching with respect to the variety of materials with which it can be employed.

When the holes 3a–3d are formed by laser beam machining, some examples of materials of which the mask can be formed include a wide variety of resins, such as polyimides, polyethylene terephthalate, nylons, polyacetals, polyethylene, polypropylene, polycarbonates, acrylic resins, polyvinyl chlorides, and polyvinylidene chlorides. The resin is preferably a heat-resistant epoxy resin, a polyimide, or polyethylene terephthalate. Polyvinyl chloride or polyvinylidene chloride which contain a halogen tend to release the halogen during laser beam machining, so they are not preferred from the standpoints of the corrosion of machinery and environmental protection.

A smaller variety of materials can be used in photoresist processing compared with those used in laser beam machining, drilling, or punching. A few nonlimiting examples of a suitable photosensitive resin composition which can be used are a photosensitive polyimide, a photosensitive epoxy resin, and a photosensitive acrylic resin. Photosensitive resin compositions can be selected from photosensitive resin compositions such as various types of resists for printed circuit boards, such as dry film photoresists, and solder resists, as well as resists for sandblasting, resists for photomilling, and resists for printing.

The fixing agent is preferably a thermoplastic material which at room temperature can hold the solder balls 4 in place in the holes in the mask 2 but which flows when heated to release the solder balls 4 from the mask 2. Some examples of materials which can be used as the fixing agent are rosin adhesives, polyethylene glycol adhesives, acrylic adhesives, rubber adhesives, polyester adhesives, polyvinyl acetate adhesives, and urethane adhesives, which may be used singly or in combination of two or more of each other.

The solderability of the solder balls 4 to the electrodes of a substrate may be enhanced if the fixing agent is capable of exerting a fluxing action during reflow soldering. Examples of fixing agents which can exert a fluxing action are ones containing carboxyl groups, hydroxyl groups, amino groups, phosphoric acid residues, halogens, and the like which are effective in soldering. Some nonlimiting specific examples of such materials are rosins, resins containing a carboxyl group (acrylic resins, urethane resins, etc.), polyvalent alcohols, imidazoles, phosphates, phosphites, and paraffin chlorides.

The fixing agent can be applied to the solder balls 4 by any suitable method, such as by spraying, printing, or brush coating. In addition, as described below, the fixing agent can be previously applied to a protective sheet 6 and may be applied to the solder balls 4 when the protective sheet 6 is attached to the mask 2.

Next, examples of a method of manufacturing a solder ball assembly according to the present invention will be explained.

FIGS. 5A–5D are vertical cross-sectional views of different steps in an example of a method of manufacturing the embodiment of FIG. 1, although this method can also be used to manufacture the other embodiments. These figures respectively correspond to the following Steps A–D of the method.

Figure 5A:
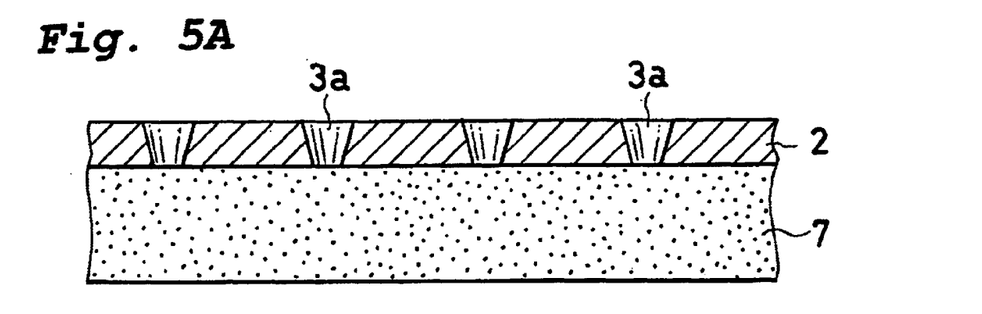
FIGS. 5A–5D are vertical cross-sectional views of different steps in an example of a method of manufacturing the embodiment of FIG. 1.

Step A:

A mask 2 like that shown in FIG. 1 having a plurality of holes 3a provided in a prescribed pattern corresponding to the pattern of electrodes on a substrate is placed atop a support surface 7 with the first side of the mask 2 facing upwards.

Figure 5B:
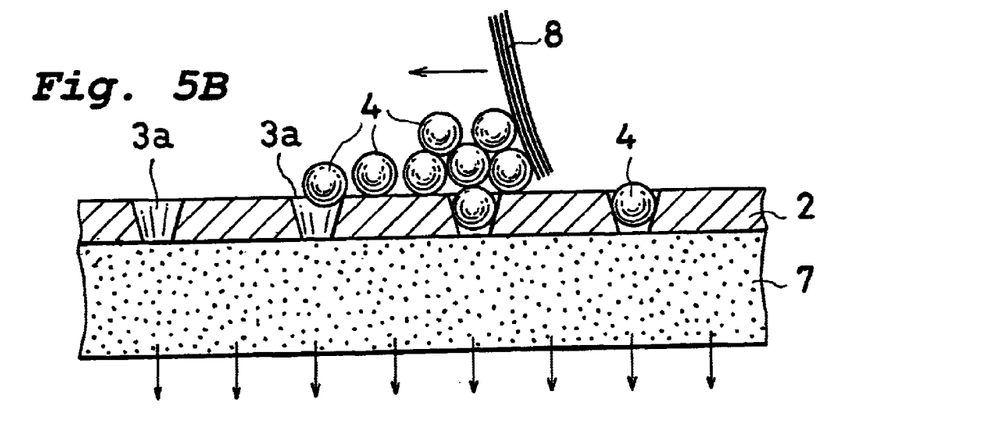

Step B:

A plurality of solder balls 4 are placed atop the first side of the mask 2, and the solder balls 4 are pushed across the first side in the direction of the arrow in FIG. 5B by a suitable member, such as a brush 8 with soft bristles. As the solder balls 4 move across the first side of the mask 2, they drop into the first ends of the holes 3a in the mask 2. The tapered shape of the holes 3a makes it easy for the solder balls 4 to fall into the holes 3a. A sufficient number of solder balls 4 are placed atop the mask 2 to fill all the holes 3a. When all the holes 3a have been filled, any extra solder balls 4 can be removed from the mask 2 by the brush 8.

Insertion of the solder balls 4 into the holes 3a can be facilitated by applying suction to the holes 3a through their second ends so as to exert an attractive force on the solder balls 4. Any mechanism capable of generating suction may be employed to apply suction to the holes 3a. The support surface 7 may itself be a device capable of generating suction, such as a suction table, or it may be a porous member which can be placed on or connected to a device for generating suction (such as a pump or a suction table), and the suction can be transmitted to the holes 3a in the mask 2 through the porous body. Some examples of a porous body which can be used as the support surface 7 are porous metals such as sintered metals, plates having holes mechanically formed therein, porous plastics, air permeable sheets, meshes, and porous fabrics.

Figure 5C:
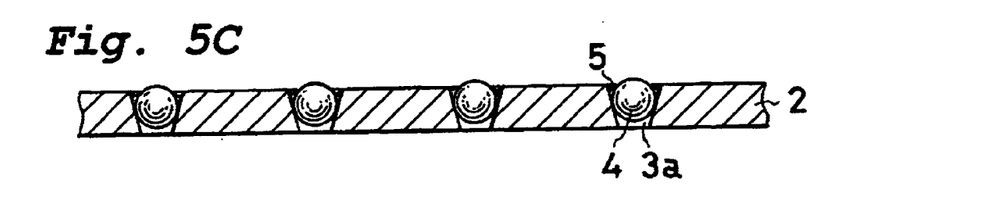

Step C:

After one solder ball 4 has been inserted into each of the holes 3a in the mask 2, a fixing agent 5 is supplied to the inside of each hole 3a to temporarily retain the solder ball 4 inside the hole 3a.

Figure 5D:
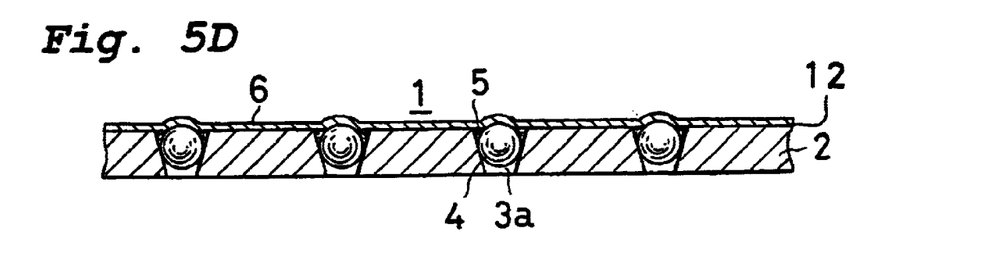

Step D:

A protective sheet 6 may be attached to the first side of the mask 2 atop the first ends of the holes 3a to protect the solder balls 4 against the environment. The protective sheet 6 can also further restrain the solder balls 4 against movement in the holes 3a. Although not employed in this example, another protective sheet 6 may be attached to the second side of the mask 2, as in the embodiment of FIGS. 2 and 3, to provide additional protection to the solder balls 4 against the environment and to prevent the solder balls 4 from falling from the second ends of the holes 3a in the mask 2.

The protective sheet 6 can be attached to the first side of the mask 2 by a variety of methods. For example, the protective sheet 6 may be previously coated with an adhesive, or it may be coated with the same fixing agent as is used to retain the solder balls 4 in the holes 3a. When the protective sheet 6 is attached to the mask 2 by an adhesive or a fixing agent, it may be helpful to apply a small amount of a suitable parting agent 12 to one or both of the protective sheet 6 and the mask 2 to make it easier to subsequently peel the protective sheet 6 from the mask 2 at the time of use of the solder ball assembly 1.

The protective sheet 6 may also be one which is adhesive when heated and which preferably also has a fluxing action.

Figure 6A:
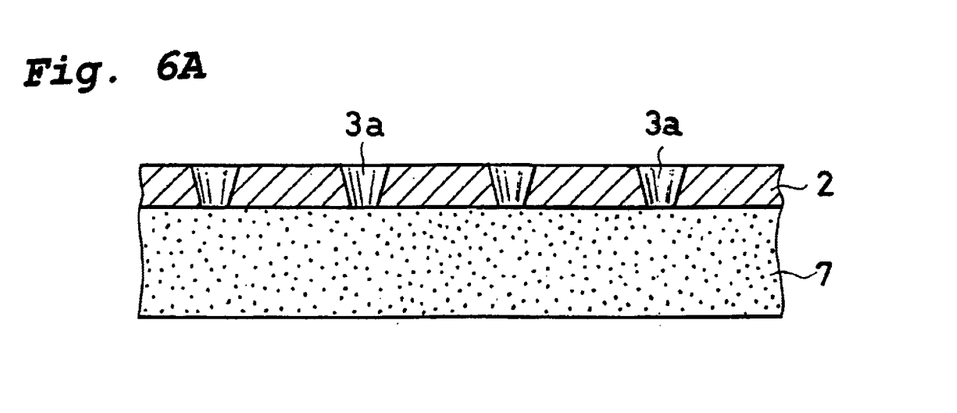
FIGS. 6A–6C are vertical cross-sectional views of different steps in another example of a method of manufacturing the embodiment of FIG. 1.
Figure 6B:
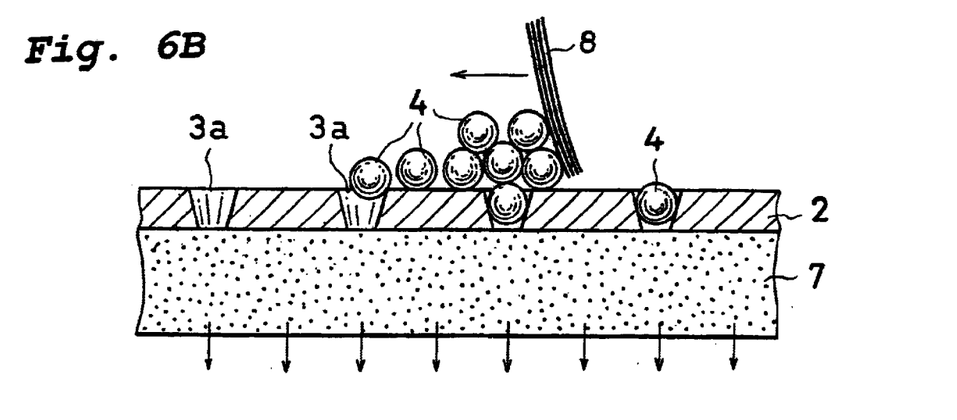
Figure 6C:
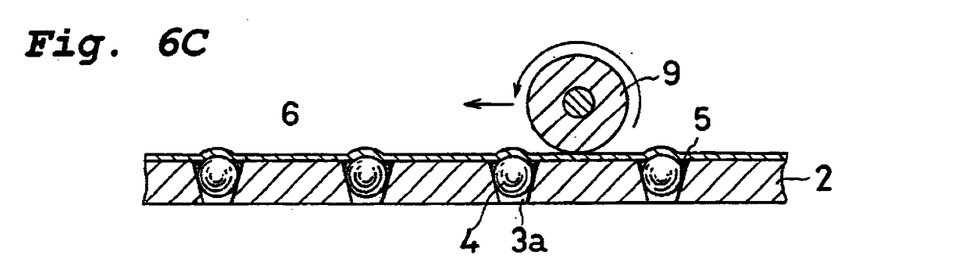

FIGS. 6A–6C are vertical cross-sectional views of different steps in an example of another method of manufacturing the embodiment of FIG. 1, although it can also be used to manufacture the other embodiments. These figures respectively correspond to the following Steps A–C of the method.

Step A:

In the same manner as in Step A of the preceding example, a mask 2 having a plurality of holes 3a provided in a prescribed pattern corresponding to the pattern of electrodes on a substrate is placed atop a support surface 7, with the first side of the mask 2 facing upwards. As in the preceding example, the illustrated support surface 7 is a porous body.

Step B:

In the same manner as in Step B of the preceding example, a plurality of solder balls 4 are moved across the first side of the mask 2 by a brush 8 while suction is applied to the second end of each hole 3a through the support surface 7 to insert one solder ball 4 into each hole 3a of the mask 2.

Step C

A protective sheet 6 to which a fixing agent was previously applied is placed atop the first side of the mask 2, and the protective sheet 6 is pressed against the first side of the mask 2 by a suitable hot pressing apparatus 9 at an elevated temperature. The hot pressing apparatus 9 may be any apparatus which can perform heating to a prescribed temperature which will melt the fixing agent on the protective sheet 6 and bond the protective sheet 6 to the mask 2. In the present example, the hot pressing apparatus 9 includes a heated roller for pressing the protective sheet 6 against the mask 2 while heating it. When the fixing agent on the protective sheet 6 is heated to a prescribed temperature, it melts or softens and flows into the holes 3a. Upon again hardening, the fixing agent 5 retains the solder balls 4 in the holes 3a. During hot pressing, the mask 2 is supported by an unillustrated support surface. If desired, a protective sheet 6 may be attached to the second side of the mask 2 by the same or a different method. This example of a manufacturing method is advantageous in that securing the solder balls 4 inside the holes 3a with the fixing agent 5 and attachment of the protective sheet 6 to the first side of the mask 2 can be performed at the same time.

After Step D shown in FIG. 5D or Step C shown in FIG. 6C, the resulting solder ball assembly 1 is ready to be used to form solder bumps on a substrate. FIGS. 7A–7D are vertical cross-sectional views of different steps in an example of a method of forming solder bumps using a solder ball assembly 1 according to the present invention. The solder ball assembly 1 being employed in this example is like the embodiment of FIG. 1, but the same method can be used for other embodiments of a solder ball assembly 1. FIGS. 7A–7D respectively illustrate the following Steps A–D of the method.

Figure 7A:
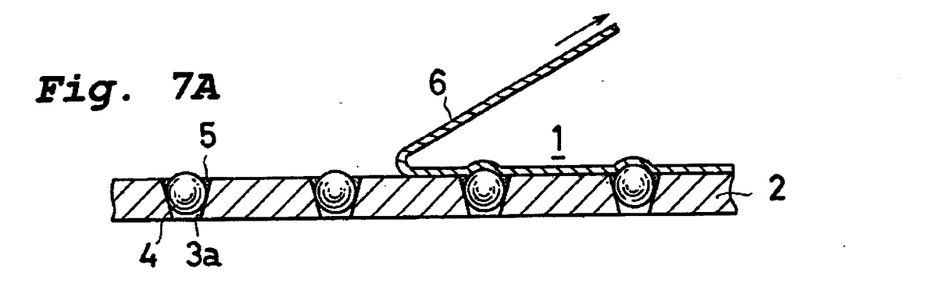
FIGS. 7A–7D are vertical cross-sectional views of different steps in an example of a method of forming solder bumps on a substrate using the embodiment of FIG. 1.

Step A:

A protective sheet 6, if present, is peeled off the first side of a solder ball assembly 1 according to the present invention. If a protective sheet 6 is present on the second side of the mask 2, the protective sheet 6 may be either peeled off or left attached to the mask 2.

Figure 7B:
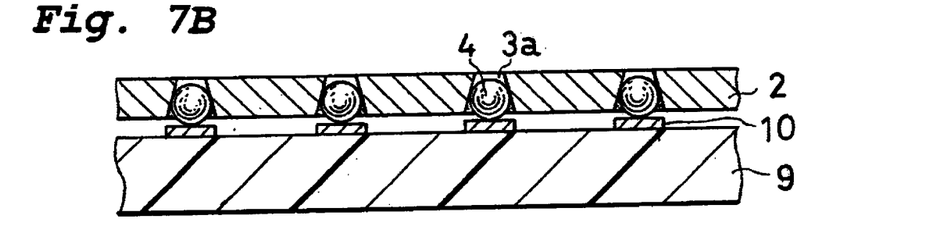

Step B:

As shown in FIG. 7B, the solder ball assembly 1 is then turned upside down (with the first side of the mask 2 facing downwards) and placed atop a substrate 9, with each of the holes 3a in the mask 2 aligned with one of the electrodes 10 of the substrate 9. A flux may be previously applied to the electrodes 10 to facilitate soldering. In this example, since each solder ball 4 extends from the corresponding hole 3a and protrudes from the first side of the mask 2, each solder ball 4 rests atop the corresponding electrode 10 of the substrate 9, with a gap between the first side of the mask 2 and the upper surface of the substrate 9. The illustrated solder balls 4 directly contact the electrodes 10 of the substrate 9. If the fixing agent 5 extends over the entire upper surface of the solder balls 4, as in the embodiment of FIG. 3, the solder balls 4 will contact the electrodes 10 through the fixing agent 5.

Figure 7C:
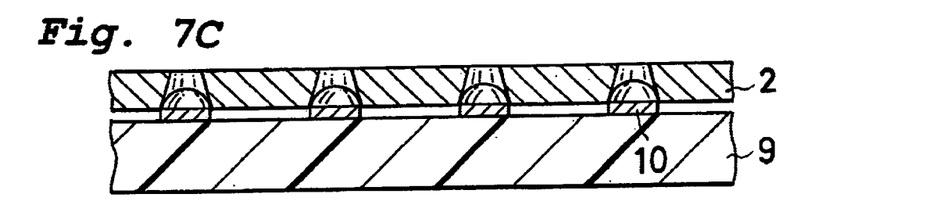

Step C:

The substrate 9 and the solder ball assembly 1 are then heated by a suitable heating apparatus such as a reflow furnace to heat the solder balls 4 to a sufficient temperature to carry out reflow. After the fixing agent 5 in the holes 3a is softened to release the solder balls 4 from constraint by the mask 2, the solder balls 4 are melted. The molten solder descends onto the electrodes 10 under its own weight and adheres to the electrodes 10.

Figure 7D:
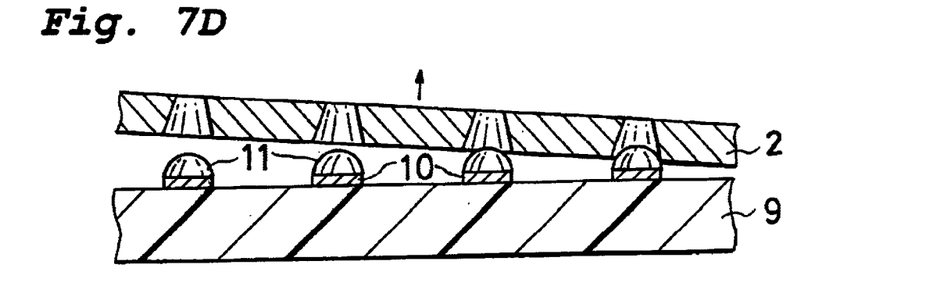

Step D:

When the solder solidifies on the electrodes 10 as solder bumps 11, the mask 2 is removed from the substrate 9, leaving the solder bumps 11 on the substrate 9.

As can be seen in FIG. 7B, when the solder ball assembly 1 is being positioned atop a substrate 9, the solder balls 4 are restrained against movement with respect to the holes 3a by the fixing agent 5, so each solder ball 4 can be precisely positioned with respect to the corresponding electrode 10 of the substrate 9 on which it is to be mounted. The holes 3a also limit the movement of the solder balls 4 as they melt, so the solder balls 4 remain aligned with the electrodes 10 up through the completion of reflow.

In the example shown in FIGS. 7A–7D, the conical shape of the holes 3a in the mask 2 enables the mask 2 to be removed from the substrate 9 without damaging the surfaces of the solder bumps 11.

In a method of disposing solder balls on electrodes in which a flux is applied to a support sheet by screen printing, solder balls are placed on the support sheet, and the support sheet is placed atop a substrate with the solder balls contacting electrodes on the substrate, it is difficult to retain the solder balls on the support sheet, so it is easy for the solder balls to be misaligned with respect to the electrodes. Furthermore, separating the support sheet from molten solder during reflow is not easy, resulting in the formation of irregularities on the solder surface. As described above, a method according to the present invention avoids such problems and can form solder bumps which are precisely positioned with respect to electrodes and which have a good surface condition.

Solder balls used in a solder ball assembly can be made from a wide variety of solder compositions. For example, they can be made from lead-containing solders, such as tin-lead eutectic solder which has long been used as a solder composition, or various types of lead-free solders, such as tin-silver eutectic solder or tin-silver-copper solder.

When preparing bumps, instead of using solder balls, a ball assembly according to the present invention can use other types of balls, such as metal balls made from copper, silver, nickel, or other materials, and plated balls having a resin or metal core plated with metal.

The diameter of solder balls used in a solder ball assembly according to the present invention can be selected based on the desired thickness of the solder bumps to be formed on electrodes, and the size and shape of the electrodes. For electrodes having a pitch of 250 $\mu$m, a typical thickness of solder bumps is 90 $\mu$m, and for electrodes with a pitch of 150 $\mu$m, a thickness of 60 $\mu$m is often desired.

The pitch of electrodes on which solder bumps are formed is normally at most 0.3 mm. Conventional methods including the solder paste method of forming solder bumps have the practical problems that they cannot guarantee a sufficient amount of solder on electrodes, particularly when the pitch of electrodes is very small, it is difficult to print an extremely fine pattern, and there is a large variation in the thickness of solder on electrodes. In contrast, a solder ball assembly according to the present invention can employ commercially available solder balls, which are widely available and which are manufactured with an extremely small variation in diameter (the variation in diameter is at most ±10 $\mu$m), so there is very little variation in the size of the resulting solder bumps, even when the pitch between electrodes is extremely small. In addition, the size of the solder balls can be selected so as to guarantee a solder bump containing a sufficient amount of solder for the intended purpose.

Another excellent characteristic of a solder ball assembly according to the present invention is that the mask is inexpensive to manufacture, so it is easy to prepare a new solder ball assembly to cope with changes in the pattern of electrodes on a substrate. Thus, a method of forming solder bumps using a solder ball assembly according to the present invention is clearly superior from the standpoint of cost and adaptability to a conventional method using a suction jig.

Yet another advantage of a solder ball assembly according to the present invention is that it is superior to other methods with respect to guaranteeing the amount of solder for a fine pitch electrode pattern.

EXAMPLES

A number of examples of a method of manufacturing a solder ball assembly according to the present invention and of a method of using the assembly to form solder bumps will next be described.

Example 1

In this example, a protective sheet having an adhesive layer is attached to the first side of a mask. The protective sheet also exerts a fluxing action.

A protective sheet having a fluxing action was prepared in the following manner.

A mixture having a rosin and an organic acid as main fluxing components was dissolved in isopropyl alcohol and coated on a polyester sheet with a thickness of 25 $\mu$m to form a coating with a dried thickness of 30 $\mu$m. The coated surface exhibited a slight stickiness at room temperature, and the stickiness further increased at 80° C.

A mask having a plurality of solder balls disposed in each of the holes provided therein was prepared in the following manner.

Ten thousand tapered holes each having a diameter of 120 $\mu$m at its first end and a diameter of 50 $\mu$m at its second end and having a pitch of 200 $\mu$m were formed by laser beam machining in a mask comprising a polyester sheet with a thickness of 125 $\mu$m. The mask was placed on a suction table with the first ends of the holes facing upwards. Solder balls having an average diameter of 100 $\mu$m were moved across the first side of the mask while suction was applied to the second ends of the holes by the suction table, and one of the solder balls was inserted into each of the holes in the mask. Excess solder balls not needed to fill all the holes were removed from the mask with a soft brush.

The protective sheet with an adhesive layer, i.e., a fixing agent layer was then placed atop the first side of the mask and pressed against the mask at 80° C. to adhere it to the mask and form a solder ball assembly. The solder balls were retained in the holes of the mask and would not fall out even if the solder ball assembly was turned upside down.

The protective sheet was then peeled off the first side of the mask, and the solder ball assembly was placed upside down (with the first side of the mask facing downwards) on a substrate having an electrode pattern, with each hole in the mask aligned with one of the electrodes of the substrate. The substrate and the solder ball assembly were together placed in a reflow furnace, and the solder balls were melted to form solder bumps with an average thickness of 90 $\mu$m on the electrodes. 100% of the solder bumps were satisfactory.

Example 2

A commercially available polypropylene sheet with a thickness of 25 $\mu$m which had been coated with an acrylic adhesive was applied to the second side of the mask of Example 1 as a lower protective sheet. The upper and lower protective sheets together isolated the solder balls in the mask from air, so surface deterioration of the solder balls by oxygen could be slowed.

Comparative Example 1

A flux pattern corresponding to an electrode pattern was printed to a film thickness of approximately 20 $\mu$m by screen printing on a polyester sheet without holes and having a thickness of 125 $\mu$m like the sheet used to form the mask of Example 1. Utilizing the stickiness of the flux, solder balls like those of Example 1 were disposed on the flux pattern, but accurate positioning of the solder balls was difficult. The polyester sheet was then placed opposite a substrate having electrodes formed thereon, with each of the solder balls contacting one of the electrodes. In this state, the polyester sheet with the solder balls thereon and the substrate were heated to reflow the solder balls. However, solder balls were not formed on 10% or more of the electrodes. A major cause of this high number of soldering defects is thought to be movement of the solder balls during alignment of the solder balls with respect to the electrodes and during reflow of the solder balls.

As described above, a solder ball assembly according to the present invention enables solder balls to be precisely positioned with respect to electrodes on a substrate, so solder balls can be formed on electrodes with certainty. The solder ball assembly is easy and inexpensive to manufacture, so it can easily accommodate changes in the pattern of electrodes on which solder bumps are to be formed. As such, a solder ball assembly according to the present invention can greatly contribute to a decrease in manufacturing costs.

What is claimed is:

1. A solder ball assembly comprising a mask having first and second sides and a plurality of holes formed therein, each hole having a first end opening onto the first side of the mask and a second end, a plurality of solder balls disposed in the holes, and a polymeric fixing agent disposed in the holes and securing the solder balls in the holes and preventing the solder balls from falling out of the holes when the mask is oriented such that the solder balls would fall out of the holes in the absence of the fixing agent.

2. A solder ball assembly as claimed in claim 1 including a protective sheet attached to the first side of the mask and covering the first end of each of the holes.

3. A solder ball assembly as claimed in claim 2 including a parting agent disposed between the mask and the protective sheet.

4. A solder ball assembly as claimed in claim 1 wherein each solder ball protrudes from the first side of the mask.

5. A solder ball assembly as claimed in claim 1 wherein the fixing agent has a fluxing action.

6. A solder ball assembly as claimed in claim 1 wherein the fixing agent is at least one substance selected from the group consisting of rosin adhesives, polyethylene glycol adhesives, acrylic adhesives, rubber adhesives, polyester adhesives, polyvinyl acetate adhesives, and urethane adhesives.

7. A solder ball assembly as claimed in claim 1 including a protective sheet attached to the second side of the mask and covering the second end of each of the holes.

8. A solder ball assembly as claimed in claim 1 wherein each hole has a depth which is less than two times the diameter of the solder ball disposed in the hole.

9. A solder ball assembly as claimed in claim 1 wherein each hole has a diameter at its first end which is at least the diameter and less than two times the diameter of the solder ball disposed therein.

10. A solder ball assembly as claimed in claim 1 wherein each hole is tapered from its first end towards its second end.

11. A solder ball assembly as claimed in claim 1 wherein each hole is cylindrical.

12. A solder ball assembly as claimed in claim 1 wherein the second end of each hole is spaced from the second side of the mask.

13. A solder ball assembly as claimed in claim 1 wherein the second end of each hole extends to the second side of the mask.

14. A solder ball assembly as claimed in claim 1 wherein the mask comprises a material selected from the group consisting of photosensitive resin compositions, plastics, ceramics, paper, metal, and glass-epoxy composites.

15. A solder ball assembly am claimed in claim 14, wherein the mask comprises a sheet.

16. A method of forming solder bumps comprising placing the solder ball assembly of claim 1 on a substrate with each of the solder balls aligned with a corresponding electrode of the substrate, then heating the solder ball assembly to cause the fixing agent to release the solder balls from the mask, reflowing the solder balls to form the solder balls into solder bumps atop the electrodes, and removing the mask from the substrate.

17. A solder ball assembly as claimed in claim 1 wherein the mask is oriented such that the solder balls would fall out of the holes in the mask in the absence of the fixing agent.

18. A solder ball assembly as claimed in claim 1, wherein each solder ball protrudes from the first side of the mask, and the assembly includes a protective sheet attached to the first side of the mask and covering the first end of each of the holes and conforming to the shape of the protruding portions of the solder balls.

19. A ball assembly comprising a mask having first and second sides and a plurality of holes formed therein, each hole having a first end opening onto the first side of the mask and a second end, a plurality of balls disposed in the holes, and a polymeric fixing agent disposed in the holes and securing the balls in the holes and preventing the balls from falling out of the holes when the mask is oriented such that the balls would fall out of the holes in the absence of the fixing agent, the balls comprising a material selected from metals, plastics, plated plastics, and ceramics.

* * * * *